(12) United States Patent
Drevillon et al.

(10) Patent No.: US 6,613,434 B1
(45) Date of Patent: Sep. 2, 2003

(54) METHOD FOR TREATING POLYMER SURFACE

(75) Inventors: Bernard Drevillon, Clamart (FR); Pavel Bulkine, Orsay (FR); Alfred Franz Hofrichter, Paris (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 0 days.

(21) Appl. No.: 09/936,223

(22) PCT Filed: Mar. 9, 2000

(86) PCT No.: PCT/FR00/00585

§ 371 (c)(1),
(2), (4) Date: Jan. 31, 2002

(87) PCT Pub. No.: WO00/53823

PCT Pub. Date: Sep. 14, 2000

(30) Foreign Application Priority Data

Mar. 9, 1999 (FR) .............................................. 99 02923

(51) Int. Cl.⁷ .............................................. B32B 27/36
(52) U.S. Cl. ........................... 428/412; 216/72; 216/79; 438/715; 438/732; 438/738; 522/1; 528/10; 528/12; 528/15
(58) Field of Search ................................ 428/412, 738; 216/72, 79; 438/715, 732, 738; 522/1; 528/12, 10, 15

(56) References Cited

FOREIGN PATENT DOCUMENTS

| | | |
|---|---|---|
| JP | 06 344 495 | 12/1994 |
| WO | WO 88/08043 | 10/1988 |
| WO | WO 99/05546 | 2/1999 |

OTHER PUBLICATIONS

Takashi S. et al., "Improvement of Adhesion to Sin Thin Film on the Polycarbonate Substrate", Electronics & Communications in Japan, Part II, vol. 74, No. 5, p. 60–70.

Bulkin P. et al., "Plasma Enhanced Chemical Vapour Deposition of Silica Thin Films in an Integrated Distributed Electron Cyclotron Resonance Reactor", Thin Solid Films, vol. 308–309, No. 1–4, p. 63–67.

Lee J H et al., "Mechanical Properties of A–C:H and A–C:H/SIOX Nanocomposite Thin Films Prepared by Ion–Assisted Plasma–Enhanced Chemical Vapor Deposition", Thin Solid Films, vol. 280, No. 1/01, p. 204–210.

*Primary Examiner*—Terressa M. Boykin
(74) *Attorney, Agent, or Firm*—Young & Thompson

(57) ABSTRACT

The invention concerns a method for treating a surface for the protection and functionalisation of polymers (4) by gas plasma deposit in a confined chamber (10) of one or several silicon alloy layers (43). The silicon alloy is selected among silicon and its oxides, nitrides, oxynitrides; the deposit is performed at a temperature less than the degradation temperature of the polymer, and a physico—chemical surface pre-treatment by plasma is performed in the same chamber before the silicon alloy is deposited; the pre-treatment consisting in a surface treatment comprising etching a surface zone of the polymer and step which consists in depositing a polymeric carbon compound.

16 Claims, 3 Drawing Sheets

METHOD FOR TREATING POLYMER SURFACE

FIELD OF THE INVENTION

The present invention concerns a method of surface treatment for the protection and functionalization of polymers (synthetic organic plastic materials). It renders the surface of a plastic material less sensitive to the environment, sets up a physical and/or chemical protective barrier, and enables the production of electronic or optoelectronic components on a polymer substrate. It is particularly useful for creating scratchproof protection, optical filtration functionalities, and barriers to water vapour or oxygen for example. It also permits the production of display screens. It can be used, but not exclusively, in the field of windows when organic materials are used to replace glass, in particular for automobiles. A polymer product obtained according to the method is also claimed.

BACKGROUND OF THE INVENTION

Methods are known by which the surface of a metal or glass material is protected by depositing one or more layers of silicon alloys, for example silica. It has been observed that the silica deposit is more adhesive, homogenous and non-porous when the substrate temperature is high during the deposit.

In addition to the protective effect of the silica, optical effects may be obtained by stacking layers of silicon alloys with different refractive indexes. These optical effects are especially optical filtration effects.

These inorganic materials are relatively heavy and do not readily lend themselves to the production of complex, pliable or flexible shapes. It is thus increasingly desirable to replace them by polymers with equivalent optical properties but which are lighter and simpler to use. However, known polymers generally have even poorer surface resistance properties against environmental chemical and/or physical attack. In particular, these are easily scratched. It has thus been proposed to protect the surfaces of these materials by the production or application of a protective layer. With this objective, one (or more) protective layers with a thickness of a few micrometers must be deposited. This layer must adhere durably. It is observed that for a layer thick enough for good anti-scratch protection, the adhesion is a critical parameter.

SUMMARY OF THE INVENTION

The invention thus concerns a method for treating surfaces for protection and functionalization of polymers, by gas plasma deposit in a confined chamber of at least one layer of a silicon alloy.

According to the invention,
the silicon alloy is selected from silicon, and its oxides, nitrides and oxynitrides;
a pre-treatment of the surface with plasma is performed in the same chamber before depositing the silicon alloy, this pre-treatment consisting of a surface treatment comprising etching (or ablation) of a surface zone of the polymer and a step of depositing a polymeric carbon compound.

The term alloy signifies a combination between silicon and one or more other atoms but must also be considered here as signifying silicon alone. The silicon oxides may be of type SiOx including silica (x=2) and the nonstoichiometric silicon oxides ($x \neq 2$). The deposit is performed at a temperature lower than the degradation temperature of the polymer. The polymer degradation temperature corresponds to a temperature at which the material softens or begins to melt or even burn, and more generally to a temperature at which the material loses its properties of use. It is thus not in general necessary specifically to heat the material in this method. If however heating is necessary, this may be performed to a temperature lower than the degradation temperature of the material.

By polymeric carbon should be understood a highly hydrogenated (at least 10% hydrogen by atomic percentage) amorphous carbon, with low optical index and high energy gap (3 to 5 eV). For example, the material listed in table 1 (a-C:H 1) has an index of 1.59 (2 eV), a hydrogen concentration of 56% and a density of 1.2 g/cm$^3$.

In various embodiments of the invention, the following means, optionally combined according to all the technically feasible possibilities, are used:

the surface treatment is performed first, followed by the deposit of the polymeric carbon compound;

the step of depositing the polymeric carbon compound is begun before the end of the surface treatment;

the preparation is obtained by the action of a plasma generated from an oxidizing gas. The oxidizing gas may, for example, be chosen from oxygen and N$_2$O;

the etched thickness of the surface zone is between 20 angstroms and 3000 angstroms;

the etched thickness of the surface zone is between 100 angstroms and 900 angstroms and is preferably approximately 500 angstroms;

the carbon compound deposit is obtained by the action of a plasma generated from a carbon-containing gas, the carbon-containing gas being chosen from methane, ethane, butane, propane, pentane, hexane and their mono or poly-unsaturated derivatives including ethylene and acetylene;

the thickness of the carbon compound deposit is between 30 angstroms and 130 angstroms and preferably between 50 angstroms and 100 angstroms;

the deposited carbon compound is a hydrogenated carbon in amorphous form;

the polymer is a polycarbonate;

the polymer is selected from the polymethyl methacrylates, the polyethylenes, the polypropylenes, the polyethylene terephthalates;

the untreated polymer is treated directly in the chamber;

several layers of silicon alloys are deposited, for example to obtain one or more optical effects;

the plasma reactor is selected from the microwave or radiofrequency reactors including the electron cyclotron resonance reactors, the distributed electron cyclotron resonance reactors, and the cathode sputtering reactors. The cathode sputtering reactors are also called "target" reactors.

the plastic material is a polycarbonate, the thickness of the layer of amorphous hydrogenated carbon is between 50 angstroms and 100 angstroms and a single layer of silica with thickness between 1 and 7 $\mu$m and preferably about 5 $\mu$m is deposited.

The invention also concerns a polymer product which has been subjected to a surface treatment for protection and functionalization.

According to the invention, the polymer treated according to any of the embodiments of the method defined above contains on its surface a prepared zone and a layer of amorphous carbon overlaid with one or more layers of one or more silicon alloys.

This method can be used to produce layers for protection and functionalization on surfaces of polymers of different shapes, the layers being durable and strongly adhesive compared to known methods. The term protection corresponds to any protection, alone or in combination, against mechanical attack, for example scratches, optical attack, for example ultraviolet, and also possibly chemical attack.

Since the plasma treatment enables large surface areas to be treated, and the steps of the method of the invention all take place in the same chamber without breaking the vacuum and without any heating of the material being necessary, high yields may be obtained. The method of plasma deposit also makes it possible to produce optical components by stacking of layers with different indexes, either with sudden rise in indexes, or by continuous variations in the indexes, or even a combination of the two. The possibility of producing an optical filter may, for example, allow protection of the bulk of the plastic material from ultraviolet radiation and thus to increase its lifetime.

In addition to the application to automobile windows, other applications are anticipated for the invention, in particular all applications where glass may be replaced by a polymer, for example the optical windows of light projectors and large-area electronic components based on a thin layer of plasma-deposited silicon. In all these applications, the polymer or plastic material is essentially selected for its lightness and optical transparency when replacing glass. The polymer may also be chosen for its advantageous mechanical properties compared to glass and particularly its ability to be bent or deformed.

The method and the plastic material treated according to the invention may have other applications, for example in the production of flexible packaging from plastic material or casings, for example for the barrier properties of the silica and, in particular, against the diffusion of water vapour and/or oxygen.

Finally, the implementation of the method is extremely simple and does not require the use of a fundamentally new plasma reactor. The method in fact can be used with any gas plasma reactor for depositing silicon alloys by simply providing for an inlet for an additional gas which is a carbon-containing gas.

BRIEF DESCRIPTION OF THE DRAWINGS

The present invention will be better understood by the following description of an embodiment of the method in which.

DETAILED DESCRIPTION OF THE INVENTION

Figure 1:
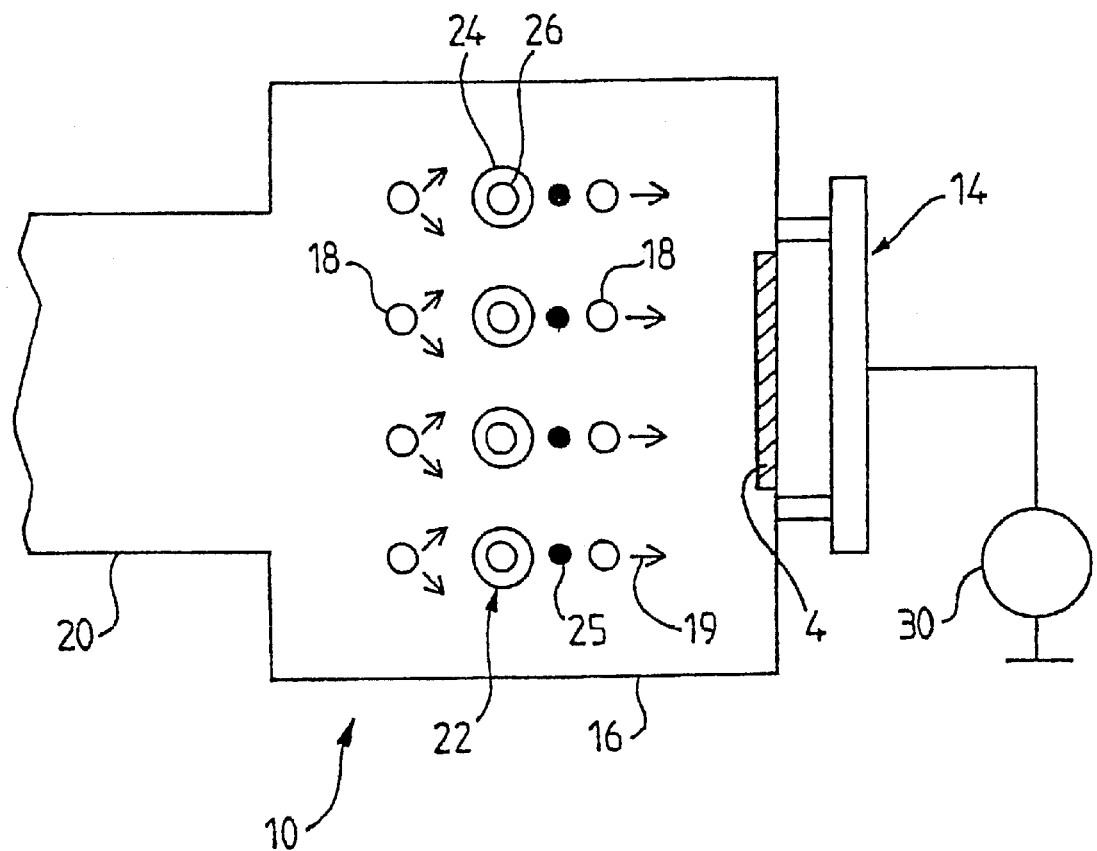
FIG. 1 represents a plasma reactor of the flat IDECR (Integrated Distributed Electron Cyclotron Resonance) type or the distributed electron cyclotron resonance microwave type.

FIG. 1 represents a treatment reactor designated by the general reference number 10. It is intended to perform the surface treatment of a plastic workpiece 4, composed for example of a polycarbonate plate on a substrate holder 14.

As can be seen on FIG. 1, the chamber 16 contains a set of inlet nozzles for gas mixtures, such as 18. The term gas mixture corresponds to any type useful for the embodiment of the invention. It is also provided with a pipe 20 for connecting the chamber 16 to a pumping unit (2 on FIG. 2) which extracts the gas delivered by the nozzles 18 and maintains the gas pressure at a desired value, for example between 1 and 10 mTorr.

The chamber 16 is equipped with a device 22 which performs the excitation of a plasma in the treatment gas, using electron cyclotron resonance. This device 22 is composed of several field applicators 24, each having a tubular shape and connected by one of their ends, by any suitable means, such as a coaxial cable, to an energy source in the microwave region (not shown), for example at a frequency of 2.45 GHz.

More particularly, the applicators 24 are preferably applicators known as "Distributed Electron Cyclotron Resonance" (DECR) or applicators produced using conventional derived techniques.

In addition, each applicator 24 is equipped with means for creating a static magnetic field in the neighbourhood of the applicator, at an intensity corresponding to the electron cyclotron resonance, in other words a static magnetic field whose intensity B is linked to the frequency f of excitation of an electron placed in this static magnetic field by the following relation:

$$B = \frac{2\pi \times m \times f}{e}$$

in which m and e are respectively the mass and the charge of the electron. Thus, for example, for an incident microwave radiation with a frequency of 2.45 GHz, the intensity of the magnetic field created in the neighbourhood of each applicator is selected to be 875 Gauss.

In the example represented in FIG. 1, the means for creating the magnetic field are constituted by an aerial surrounded by a longitudinal magnet 26, located inside each applicator 24. This construction gives a static magnetic field whose value decreases relatively quickly, and thus gives a weak, or even zero static magnetic field in the zone where the workpiece 4 to be treated is located. In addition, because of the intense absorption of the microwave field in the neighbourhood of the applicators, the excitation of the plasma does not take place in the immediate neighbourhood of the substrate, thus reducing the risk of damaging it.

It can be seen on FIG. 1 that the reactor 10 is complemented by a set of metal bars 25, extending transversely and parallel to the applicators 24. These bars 25 are connected to the ground, in other words to the wall of the chamber 16, to comprise a ground reference along each applicator so as to structure the microwave field into this zone and facilitate the propagation of the incident radiation.

The reactor 10 is, for the embodiment represented, complemented by an electromagnetic field source 30, for example at a frequency of 13.56 MHz, giving a polarization of the substrate holder, as will be described below.

Microwave power is injected by means of each applicator 24, in the neighbourhood of each inlet nozzle 18 and, simultaneously, a static magnetic field is created in this zone, in other words in a zone of the chamber 16 distinct from the zone in which the workpiece 4 to be treated is located, the intensity of the magnetic field corresponding, as described above, to the electron cyclotron resonance. The static magnetic field lines created loop between two neighbouring magnets, and thus delimit a multipolar magnetic field structure between the applicators.

A strongly dissociated plasma is thus obtained, at low pressure and very active, to be used to treat the workpiece 4.

The substrate holder 14 is optionally subjected to the influence of a high frequency electric field, leading to its polarization. When it is subjected to the influence of a positive alternation of the electric field delivered by the source 30, the electrons are attracted towards the workpiece 4, while when it is subjected to the influence of a negative alternation, the positive ions are attracted towards the workpiece 4.

Given that the electrons are more mobile than the ions, a polarization of the substrate holder is obtained, this polarization being adjustable under the control of the source 30. It is thus possible to control the energy of the ions arriving at the surface of the workpiece 4 to be treated.

The plasma reactors of the IDECR type enable the cold deposit of dense silicon-based layers. The term cold signifies that it is not generally necessary specifically to heat the material or, if heating is performed, to a temperature lower than the degradation temperature of the material.

Although FIG. 1 represents a particular type of plasma reactor, other types of plasma reactor may be used and, for example, the cathode sputtering reactors also called "target" plasma reactors, where the material to be deposited is extracted from a target located in the chamber. The reactors may be of the 2.45 GHz microwave or 13.56 MHz radiofrequency type. Plasma generators which may be used in the present invention are described in "Handbook of plasma processing technology", S. Rossnagel, J. Cuomo, W. Westwood, Noyes publication, Parkridge 89. The IDECR generators are more particularly described in an article by P. Bulkin in "Thin Solid Films" N° 308, 309, 1997, page 63.

Figure 2:
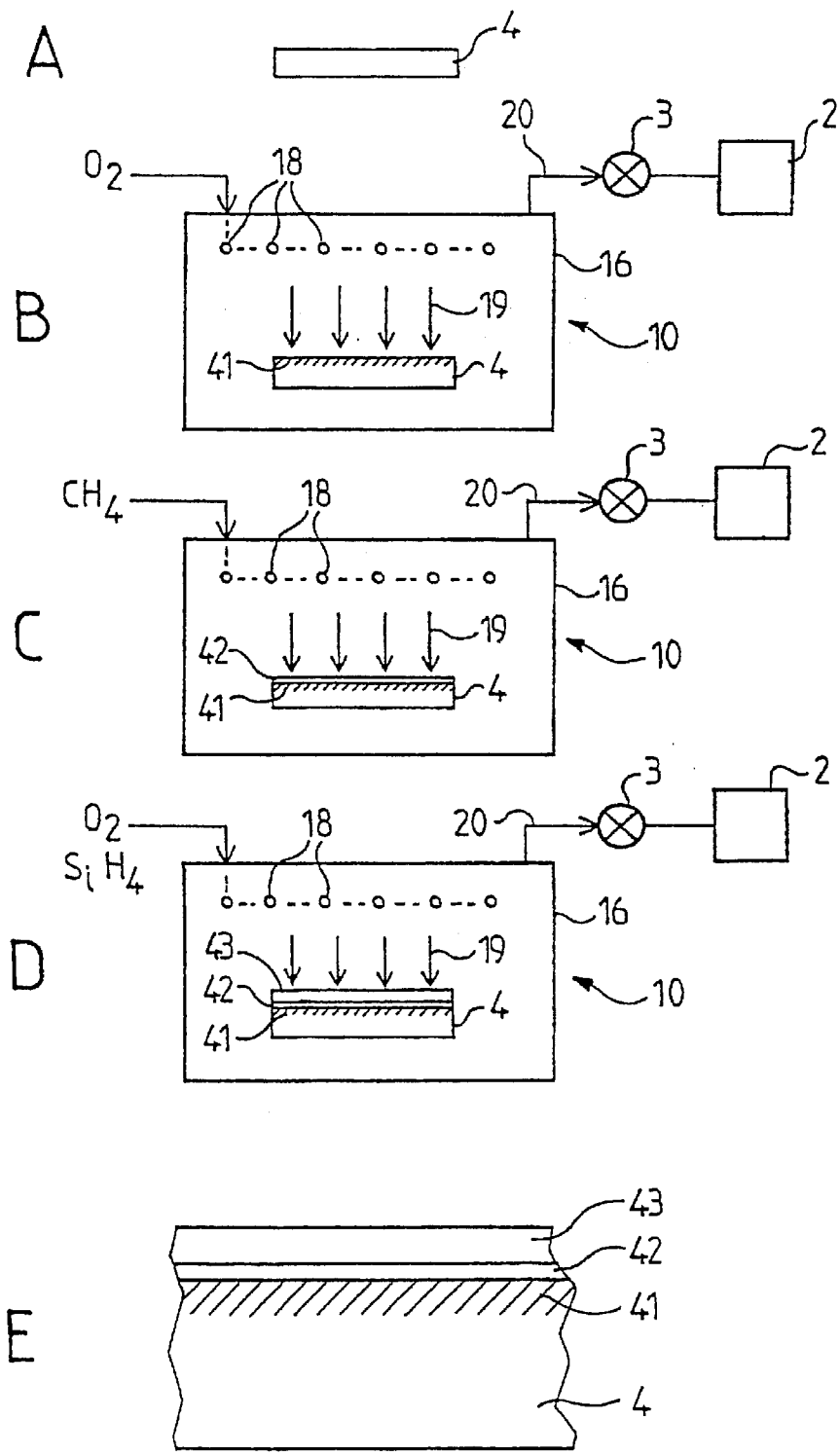
FIG. 2 represents the steps of the method according to the invention.

On FIG. 2, the steps of the method are represented by the references A to D.

In A, an untreated polymer, plastic material 4, is used. The term untreated signifies that the material may be treated directly and that no pre-treatment is necessary other than that of the invention and an optional surface cleaning to remove foreign bodies, for example dirt or dust. This optional cleaning, if the material is dirty, corresponds for example to chemical degreasing. The invention is also applicable to plastic materials pre-treated by a conventional chemical cleaning of the degreasing type. In this example, the plastic material is polycarbonate.

In B, the plastic material 4 is placed in the chamber 16 of the plasma reactor 10, in which a vacuum of about 5 mTorr is created by the pipe 20 connected to a vacuum pump 2 via a valve 3 and/or a regulator. An oxidizing gas, oxygen in gaseous form in this embodiment, is admitted into the chamber 16 by the inlets 18. The plasma generators, not shown in this figure, create a plasma 19 which prepares the surface of the material 4 over a certain thickness. This surface preparation may correspond to several physico-chemical actions:

the cleaning by desorption of the surface residues (for example hydrocarbons),
the ablation, or etching, of a surface zone of the polymer,
the activation of the surface zone 41 of the polymer; said activation may include a crosslinking of the polymer, a degradation of the polymer, grafting of oxygen or oxygenated groups onto the surface,
a mechanical action of abrasion of the surface,
a combination of these actions, or even other causes not yet specified. The duration of this preparation is chosen so as to correspond to a thickness of the etched zone of about 500 angstroms.

In C, the carbon compound is deposited onto the activated plastic material. The carbon in this embodiment is generated by the plasma from a gas which is methane and which is injected into the chamber 16 through the inlets 18. The deposited carbon is thus in the form of amorphous hydrogenated carbon. In this latter case, it is advisable to ensure that the layer of carbon deposited contains enough hydrogen. However, any other gaseous source of carbon may be used, as well as the carbon originating from a cathode sputtering reactor. The duration of this step corresponds to a thickness of the carbon layer 42 of between 50 angstroms and 100 angstroms.

In D, the silica is deposited on the plastic material pre-treated in steps B and C. The plasma reactor 10 receives oxygen and silane for example. However in the case of the use of a cathode sputtering reactor, the silicon is obtained from a target of this material located in the same chamber. In this example, a single layer 43 of silicon of about 5 $\mu$m thickness is deposited.

In E, the plastic material is removed from the reactor, as the treatment to protect the plastic material has been completed. An enlargement of the treated surface is represented in E. The plastic material 4 contains on its surface an activated zone 41, a layer of amorphous hydrogenated carbon 42 and a layer of silica 43. Since the method allows the production of a quality deposit without the need for heating the substrate specifically, the plastic material does not undergo any degradation or other particular constraint which might compromise its qualities of use. The method thus allows the production of at least one deposit at at least room temperature.

Another possible embodiment consists of a gradual transition between the etching phase and the phase of depositing the silica layer, passing via the deposit of a layer of hydrogenated amorphous carbon. Thus by starting initially with a pure $O_2$ plasma, the speed of etching can be reduced by gradually increasing the partial pressure of the carbon-containing gas (for example $CH_4$), until a layer of hydrogenated amorphous carbon has been deposited. This increase in the partial pressure of carbon-containing gas may be accompanied by a reduction in the partial pressure of $O_2$. The partial pressure of carbon-containing gas may subsequently be gradually reduced and the partial pressure of the precursor of the silicon alloy deposit (for example $SiH_4$) may be gradually increased, until the conditions for the deposition of a silicon alloy layer (for example silica) are reached.

Comparative tests have been carried out. These tests were performed in accordance with the following standard tests:

Determination of the resistance to wear by abrasive rollers (Taber wear test) (DIN 52347). This test consists of moving a standard roller (CS F10) with a fixed standard force (500 g) for a fixed number of cycles (500 or 1000) over the sample and measuring the haze change (Delta Haze), i.e. evaluating the opacity by measuring the quantity of light transmitted and diffused.

Cross hatch test (DIN EN ISO 2409). This test consists of cutting a 10 ×10 1 mm$^2$ cross hatch, applying an adhesive tape, and removing it. The number of squares of the layer which remain attached to the substrate is a functional measure of the adhesion of the layer.

Thermal cycles. This test consists of subjecting the sample to 10 cycles of −40° to +90° C. over 5 days.

Figure 3:
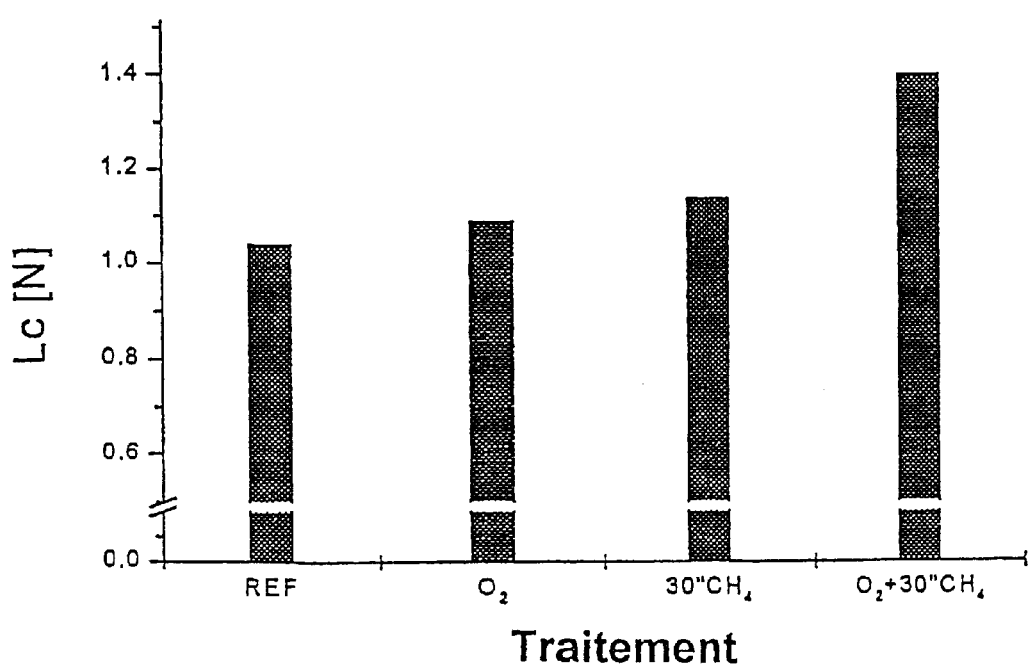
FIG. 3 shows the results of scratch tests.

We also performed scratch tests whose results are shown in FIG. 3. This test consisted of introducing stresses at the interface between the coating and the substrate, which was achieved by pressing a diamond stylus onto the surface of the sample with a normal load. The sample was then moved at constant speed and the result of the stresses at the interface produced a scratch or scaling of the coating. The critical load Lc, i.e the smallest load causing a defect on the sample, was recorded.

FIG. 3 thus shows as ordinate the critical load and as abscissa the results obtained for respectively a reference sample, a sample subjected only to the step of treatment with a plasma generated from an oxidizing gas, the result obtained with a sample having received only the deposit of a layer of a polymeric carbon compound (from $CH_4$) and finally the result obtained with a sample according to the invention, in other words having received a pre-treatment consisting of a step of surface treatment comprising the etching by a plasma generated from an oxidizing gas, followed by a step of depositing a polymeric carbon compound (from $CH_4$)

RESULTS OF TESTS

Without pre-treatment, the layers of $SiO_2$ on polycarbonate scaled above a thickness of 2 μm. In contrast, by using the pre-treatment according to the method of the invention, not only did they not scale, but also withstood the treatment by thermal cycle without scaling and showed good resistance to water. In particular:

An anti-scratch coating of 4.5 μm of $SiO_2$ was deposited on polycarbonate. Substrate: a PC plate (10×10×0.3 cm) produced by extrusion or injection

TABLE 1

Deposit conditions for different layers

| | gas | flow [sccm] | pressure [Torr] | Power MO [W] | Time [s] |
|---|---|---|---|---|---|
| Cleaning $O_2$ | $O_2$ | 30 | 1.14 | 100 | 100 |
| Layer a-C:H 1 | $CH_4$ | 21 | 0.78 | 100 | 30 |
| Layer a-C:H 2 | $C_2H_4$ | 30 | 1.07 | 100 | 5 |
| Layer $SiO_2$ | $SiH_4$ | 5 | 1.14 | 100 | 10000 |
| | $O_2$ | 24 | | | |
| Gradient phase 1 | $O_2$ | 30☐0* | | 100 | 20 |
| | $CH_4$ | 0☐21* | | | |
| Gradient phase 2 | $O_2$ | 0☐24* | | 100 | 20 |
| | $CH_4$ | 21☐0* | | | |
| | $SiH_4$ | 0☐5* | | | |

*linear variation over 20 seconds

Cross hatch test

| | Number of squares remaining |
|---|---|
| Treatment $O_2$ only | scaling |
| Treatment $CH_4$ only | 30% |
| Treatment $O_2$ + $CH_4$ | 100% |
| Treatment $O_2$ + $C_2H_4$ | 100% |
| Treatment $O_2$ + Gradient phase 1 + Gradient phase 2** | 100% |

**The plasma was continuous during the sequence of treatments

Wear resistance as a function of the layer thickness

| | 3.5 μm | 5.5 μm |
|---|---|---|
| Haze change (Delta Haze) after 1000 cycles (roller CS F10-500 g) | 14.6% | 2.06% |

These tests show that a treatment according to the invention gives better adhesion than when the silicon alloy deposit is performed without pre-treatment or with an incomplete pre-treatment.

What is claimed is:

1. Method for treating a surface of a polymer for protection and functionalization comprising: gas plasma depositing in a confined chamber (16) at least one layer (43) of a silicon compound on the surface of the polymer, characterized in that the silicon compound is selected from silicon and its oxides, nitrides and oxynitrides and further comprising pre-treating the surface of the polymer by plasma in the chamber before depositing the silicon compound, the pre-treatment consisting of a surface treatment comprising etching a surface zone of the polymer and a step of depositing a strongly hydrogenated amorphous polymeric carbon compound (42) with at least 10% of hydrogen by atomic percentage.

2. Method according to claim 1, characterized in that the surface treatment is performed first, followed by the deposit of the polymeric carbon compound.

3. Method according to claim 1, characterized in that the step of depositing the polymeric carbon compound is begun before the end of the surface treatment.

4. Method according to claim 1, characterized in that the treatment is obtained by the action of a plasma (19) generated from an oxidizing gas.

5. Method according to claim 1, characterized in that the etched thickness of the surface zone is between 20 angstroms and 3000 angstroms.

6. Method according to claim 1, characterized in that the etched thickness of the surface zone is between 100 angstroms and 900 angstroms.

7. Method according to claim 1, characterized in that the deposit (42) of the polymeric carbon is obtained by the action of a plasma (19) generated from a carbon-containing gas, the carbon-containing gases being selected from methane, ethane, butane, propane, pentane, hexane and their mono or polyunsaturated derivatives including ethylene and acetylene.

8. Method according to claim 1, characterized in that the thickness of the deposit (42) of the carbon compound is between 30 angstroms and 130 angstroms.

9. Method according to claim 1, characterized in that the polymer is polycarbonate.

10. Method according to claim 1, characterized in that the polymer is a plastic material selected from the polymethyl methacrylates, the polyethylenes, the polypropylenes, the polyethylene terephthalates.

11. Method according to claim 1, characterized in that the polymer (4) is treated directly in the chamber.

12. Method according to claim 1, characterized in that several layers of silicon compounds are deposited.

13. Method according to claim 1, characterized in that the plasma reactor is a distributed electron cyclotron resonance reactor.

14. Method according to claim 1, characterized in that the plasma reactor is selected from the microwave or radiofrequency reactors including the cathode sputtering reactors.

15. Polymer product treated on the surface for protection and functionalization, characterized in that the protection is performed by the method according to claim 1 and that the polymer (4) contains on its surface an activated zone (41) and a layer (42) of amorphous hydrogenated carbon overlaid with one or more layers (43) of one or more silicon compounds.

16. Product according to claim 15, characterized in that the polymer is polycarbonate.

* * * * *